(12) United States Patent
Alfier et al.

(10) Patent No.: US 11,355,481 B2
(45) Date of Patent: Jun. 7, 2022

(54) MULTI-COB-LED LIGHTING MODULE

(71) Applicant: OSRAM GmbH, Munich (DE)

(72) Inventors: Alberto Alfier, Vedelago (IT);
Xiaolong Li, Montebelluna (IT)

(73) Assignee: OSRAM GmbH, Munich (DE)

( * ) Notice: Subject to any disclaimer, the term of this patent is extended or adjusted under 35 U.S.C. 154(b) by 109 days.

(21) Appl. No.: 17/050,114

(22) PCT Filed: Apr. 26, 2019

(86) PCT No.: PCT/IB2019/053435
§ 371 (c)(1),
(2) Date: Oct. 23, 2020

(87) PCT Pub. No.: WO2019/207533
PCT Pub. Date: Oct. 31, 2019

(65) Prior Publication Data
US 2021/0098433 A1 Apr. 1, 2021

(30) Foreign Application Priority Data

Apr. 27, 2018 (IT) .......................... 102018000004928

(51) Int. Cl.
*H01L 25/075* (2006.01)
*H01L 33/48* (2010.01)
*H01L 33/62* (2010.01)
*H01L 27/15* (2006.01)
*H01L 33/38* (2010.01)

(52) U.S. Cl.
CPC ........ *H01L 25/0753* (2013.01); *H01L 27/156* (2013.01); *H01L 33/387* (2013.01); *H01L 33/483* (2013.01); *H01L 33/62* (2013.01)

(58) Field of Classification Search
CPC . H01L 27/156; H01L 33/387; H01L 25/0753; H01L 33/62
See application file for complete search history.

(56) References Cited

U.S. PATENT DOCUMENTS

| | | |
|---|---|---|
| 9,478,587 B1 | 10/2016 | Liu et al. |
| 2006/0067073 A1 | 3/2006 | Ting |
| 2013/0026510 A1 | 1/2013 | Lin et al. |
| 2015/0267907 A1* | 9/2015 | Thompson ................ F21K 9/64 362/249.06 |
| 2015/0280088 A1 | 10/2015 | Tsuchiya et al. |

FOREIGN PATENT DOCUMENTS

WO 2008/069204 A1 6/2008

* cited by examiner

*Primary Examiner* — Feifei Yeung Lopez
(74) *Attorney, Agent, or Firm* — DLA Piper LLP (US)

(57) ABSTRACT

A multi-COB-LED lighting module includes a submount; and a plurality of clusters of LED-chips that emit light radiation in respective emission bands, wherein each LED-chip cluster includes a plurality of LED-chips arranged on the submount by chip on board technology and emit light radiation in a respective emission band, and at least two LED-chips of at least a first LED-chip cluster each borders with a plurality of LED-chips belonging to one or more clusters of LED-chips different from the first LED-chip cluster and connect one to the other by at least a wire bond that extends above one or more of the adjoining LED-chips.

10 Claims, 4 Drawing Sheets

MULTI-COB-LED LIGHTING MODULE

TECHNICAL FIELD

This disclosure relates to a multi-COB-LED lighting module.

BACKGROUND

The use of LEDs as lighting sources is becoming increasingly widespread due to many advantages, compared to traditional incandescent and fluorescent lamps, mainly with regard to consumption, versatility and control flexibility, which allows creation of the most varied effects. In fact, LEDs are frequently used for indoor and outdoor lighting. Among the many uses, for example, LEDs can be advantageously exploited for street lighting and illumination of monuments and architectural structures, in the entertainment field for production of stage lights (both for effects and making Wash Light type projectors). In interiors, LEDs are often preferred even for home lighting.

It is also known that COB-LED lighting modules, made using the so-called "Chips On Board" technology, are particularly successful in the lighting field. The COB-LED lighting modules generally comprise a common supporting layer (hereinafter "COB-submount") and a plurality of clusters of LED-chips housed on the supporting layer according to a geometric matrix distribution and are adapted, in use, to emit light radiation in respective emission bands associated with corresponding lights of colors different from one another.

The COB-LED lighting modules described above have numerous advantages that include: having a particularly compact light emitting surface (Light Emitting Surface—LES), allowing the light color to be adjusted within a relatively large range of color shades, and perform a pre-mixing of the colored lights already in the emission phase of the same by the LED-chips thanks to the uniform distribution of the latter.

Despite the numerous advantages described above, currently there is a technical need to be able to further increase the pre-mixing of the colored lights by the COB-LED lighting modules without, however, affecting the compactness of the light emitting surface of the modules.

It could therefore be helpful to provide a multi-LED lighting module based on COB technology that allows increasing the pre-mixing of the light already at the emission time by the LED-chips without compromising the compactness of the light emitting surface.

SUMMARY

We provide a multi-COB-LED lighting module including a submount, and a plurality of clusters of LED-chips that emit light radiation in respective emission bands, wherein each LED-chip cluster includes a plurality of LED-chips arranged on the submount by chip on board technology and emit light radiation in a respective emission band, and at least two LED-chips of at least a first LED-chip cluster each borders with a plurality of LED-chips belonging to one or more clusters of LED-chips different from the first LED-chip cluster and connect one to the other by at least a wire bond that extends above one or more of the adjoining LED-chips.

BRIEF DESCRIPTION OF THE DRAWINGS

Our lighting module will now be described with reference to the annexed drawings that illustrate non-limiting examples.

DETAILED DESCRIPTION

Figure 1:
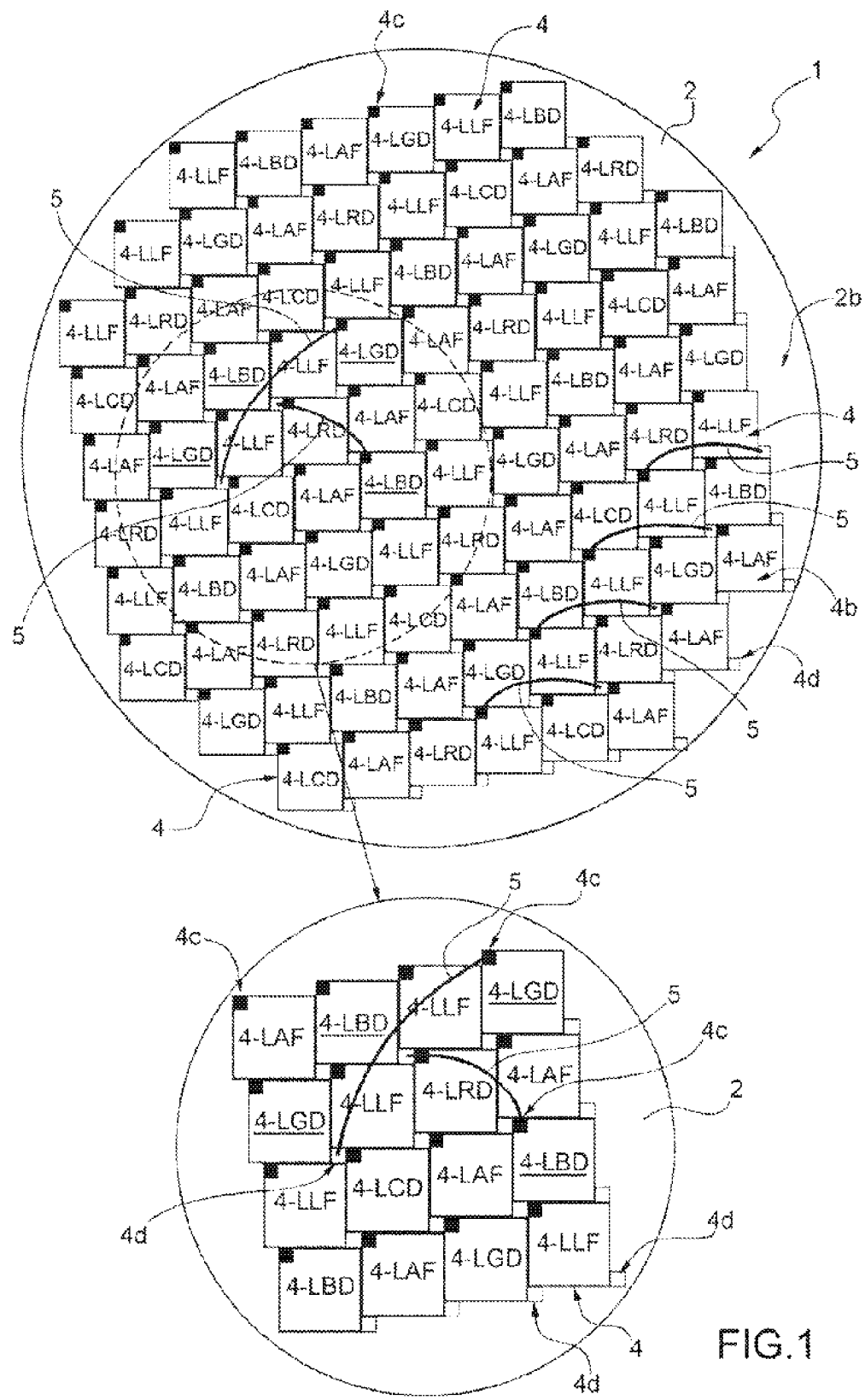
FIG. 1 is a simplified front view, with parts enlarged for clarity, of a multi-COB-LED lighting module.

Our multi-COB-LED lighting module comprises: a submount, a plurality of clusters of LED-chips, designed to emit light radiation in respective emission bands, each LED-chip cluster comprises a plurality of LED-chips arranged on the submount by a chip on board technology, at least two LED-chips of at least a first LED-chip cluster each adjoining a plurality of LED-chips belonging to one or more clusters of LED-chips different from the first LED-chip cluster to be separated from one another and are mutually connected by at least one wire bond that extends above one or more adjoining LED-chips.

Preferably, the LED-chips are arranged on the submount in positions adjacent one to the other to approximately form an LED-chip matrix and each comprising one or more top terminals and at least one bottom terminal, at least one top terminal of one of the two LED-chips of the first LED-chip cluster is connected to a bottom terminal of the other LED-chip of the first LED-chip cluster by a wire bond that extends above one or more adjoining LED-chips.

Preferably, the at least one top terminal is arranged on the top surface of the LED-chip, and the bottom terminal protrudes from a side of the LED-chip.

Preferably, at least one terminal of an LED-chip adjoins a terminal of another LED-chip.

Preferably, the clusters of LED-chips comprise five or more of the following clusters of LED-chips: a) an LED-chip cluster comprising a plurality of direct emission blue LED-chips, or b) an LED-chip cluster comprising a plurality of direct emission cyan LED-chips, or c) an LED-chip cluster comprising a plurality of direct emission green LED-chips, or an LED-chip cluster comprising a plurality of direct emission red LED-chips, and or) an LED-chip cluster comprising a plurality of phosphor-converted amber LED-chips, or f) an LED-chip cluster comprising a plurality of phosphor-converted lime LED-chips, or g) an LED-chip cluster comprising a plurality of direct emission aquamarine LED-chips, or h) an LED-chip cluster comprising a plurality of direct emission or phosphor-converted deep red LED-chips, or i) an LED-chip cluster comprising a plurality of direct emission or phosphor-converted deep blue LED-chips, or l) an LED-chip cluster comprising a plurality of warm white light LED-chips, or m) an LED-chip cluster comprising a plurality of cold white LED-chips; or n) an LED-chip cluster comprising a plurality of UV-A LED-chips, or o) an LED-chip cluster comprising a plurality of UV-B LED-chips, or p) an LED-chip cluster comprising a plurality of UV-C LED-chips or q) an LED-chip cluster comprising a plurality of IR LED-chips.

Preferably, the first LED-chip cluster comprises one of the following clusters of LED-chips: a) an LED-chip cluster comprising a plurality of direct emission blue LED-chips, or b) an LED-chip cluster comprising a plurality of direct emission cyan LED-chips, or c) an LED-chip cluster comprising a plurality of direct emission green LED-chips, or d) an LED-chip cluster comprising a plurality of direct emission red LED-chips, or h) an LED-chip cluster comprising a plurality of direct emission or phosphor-converted deep red LED-chips, or i) an LED-chip cluster comprising a plurality of direct emission or phosphor-converted deep blue LED-chips, or l) an LED-chip cluster comprising a plurality of warm white LED-chips, or m) an LED-chip cluster comprising a plurality of cold white LED-chips, or n) an LED-chip cluster comprising a plurality of UV-A LED-chips, or o) an LED-chip cluster comprising a plurality of UV-B LED-chips, or p) an LED-chip cluster comprising a plurality of UV-C LED-chips or q) an LED-chip cluster comprising a plurality of IR LED-chips.

Preferably, the LED-chips belonging to a same LED-chip cluster are electrically connected one to the other by the wire bonds according to a series/parallel configuration.

Preferably, the LED-chips are ranging between forty and fifty, or between eighty and ninety.

Preferably, the LED-chips are quadrangular, preferably square, hexagonal or rhomboidal shaped.

Preferably, the LED-chips have dimensions of approximately 0.58 mm×0.58 mm (20×20 mils) to approximately 1.43 mm×1.43 mm (45×45 mils).

Preferably, the bottom surface and/or the top surface of the submount is approximately flat.

Preferably, the bottom surface and/or the top surface of the submount is curved, concave or convex.

Preferably, the submount has a circular shape.

Our lighting modules will now be described in detail with reference to the attached Figures to allow those skilled in the art to make and use it. Various modifications to the examples will become immediately apparent to those skilled in the art and the generic principles described can be applied to other examples and applications without thereby departing from the scope of the appended claims. Therefore, this disclosure should not be considered limited to the described and illustrated examples, but the broader protective scope must be conferred according to the principles and characteristics described and claimed herein.

With reference to FIG. 1, number 1 denotes as a whole a multi-COB-LED lighting module obtained by using the chips on board technology, whose acronym is "COB."

The multi-COB-LED lighting module 1 comprises a submount 2, and a plurality of clusters of LED-chips arranged on the submount 2 according to the configurations described in the following. The clusters of LED-chips are adapted to emit, in use, electromagnetic radiation, preferably light radiation in respective emission bands comprised between a plurality of predetermined emission bands described in detail in the following.

Each LED-chip cluster comprises, in turn, a plurality of LED light sources consisting of respective LED-chips 4 that are stably coupled/housed with/in the submount 2 by the COB technology. The LED-chips 4 belonging to one or more each LED-chip cluster are adapted to emit, in use, electromagnetic radiation, preferably light radiation in the same predetermined emission band, by respective emitting areas.

Figures 2, 3:
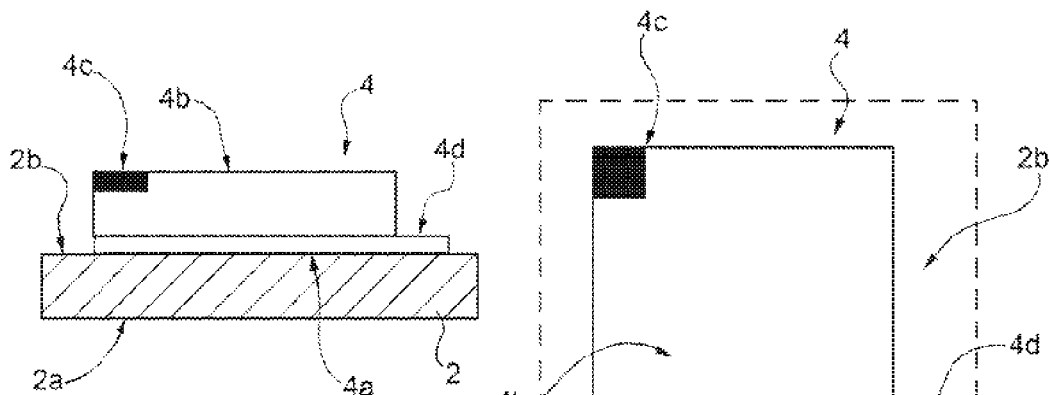
FIG. 2 is a simplified section view of a portion of the multi-COB-LED lighting module shown in FIG. 1.
FIG. 3 is a simplified front view with parts enlarged for clarity, of a portion of the multi-COB-LED lighting module obtained according to an example.

According to a preferred example shown in FIGS. 1, 2 and 3, the submount 2 (substrate/submount) may have a bottom surface 2a and an opposite top surface 2b, on which the bases or bottom surfaces 4a of the LED-chips 4 are stably arranged.

According to a preferred example shown in FIGS. 1, 2 and 3, the bottom surface 2a and/or the top surface 2b of the submount 2 is approximately flat. However, according to other examples (not illustrated), the top surface 2b of the submount 2 can be curved, for example, concave or convex. The geometric shape of the submount 2 depends on the lighting device on which the multi-COB-LED lighting module 1 is installed. In the examples shown in the accompanying Figures, the submount 2 has a circular shape. The submount 2 can be made, for example, of a ceramic material.

It is, however, to be understood that this disclosure should not be considered limited to a submount of circular geometric shape and/or made of a ceramic material, but may provide both different alternative geometric shapes, for example, rectangular or hexagonal, and the use of different materials such as alumina or aluminium nitride (AlN).

With reference to FIGS. 2 and 3, the LED-chips 4 can each comprise a top surface 4b, opposite the bottom surface 4a, that comprises the aforementioned emitting area.

According to a preferred example shown in the Figures, the LED-chips 4 can conveniently have an approximately quadrangular shape, preferably square. However, our lighting module should not be considered limited to the use of LED-chips 4 having a square or rectangular shape. In other examples, the LED-chips 4 can be hexagonal allowing a tessellation of the honeycomb-shaped submount 2, or alternatively, rhombus-shaped allowing a tessellation of the Penrose-shaped submount 2, or they can be approximately circular.

The LED-chips 4 can comprise, for example, micro-LEDs (µLED) and/or regular chips. For example, micro-LEDs (µLED) can have dimensions of about 0.58 mm×0.58 mm (20×20 mils) to about 1.43 mm×1.43 mm (45×45 mils).

In the preferred examples illustrated, the LED-chips 4 of the multi-COB-LED lighting module 1 can have the same dimensions. In other examples, the LED-chips 4 can however have different dimensions from one another.

With reference to FIG. 1, the LED-chips 4 are housed on the top surface 2b of the submount 2 to approximately form a matrix of rows and columns. The LED-chips 4 are arranged adjacent one to the other in a substantially contiguous manner, but remaining electrically isolated from one another.

The LED-chips 4 arranged along the rows and the columns of the matrix may have the sides approximately parallel to, but slightly misaligned (offset) with respect to, the corresponding sides of the adjacent LED-chips 4, and delimit with the same, preferably in groups of four LED-chips 4, free portions (not illustrated) on the top surface 2b of the submount 2.

According to a preferred example shown in the accompanying Figures, each LED-chip 4 is provided with at least one first and at least one second external electrical connection terminal, both in view. One of the two terminals is electrically connected to the anode of the LED-chip 4 and the other terminal is electrically connected to the cathode of the LED-chip 4.

One of the two terminals, indicated hereinafter with top terminal 4c, may be arranged on the top surface 4b of the LED-chip 4 preferably approximately the external perimeter edge, preferably approximately at a first vertex of the square formed by the meeting point of a first and a second side of the LED-chip 4. The other terminal of the LED-chip 4, indicated hereinafter with bottom terminal 4d, may be arranged on the bottom surface 4a of the LED-chip 4 preferably at a second vertex of the square, diagonally opposite relative to the first vertex, and formed by the meeting point of a third and fourth side of the LED-chip 4.

The bottom terminal 4d can be conveniently shaped to project from a side of the LED-chip 4 and can be sized to occupy the free portion (not illustrated) present on the top surface 2b of the submount 2 delimited by the four adjacent LED-chips 4. The bottom terminal 4d can have a reduced thickness, i.e., being approximately laminar, and preferably have an approximately quadrangular, preferably square, perimetral shape.

According to an example, the bottom terminal 4d can be shaped to extend, at least partially, on the bottom surface 4a of the LED-chip 4 and/or it can be part of a layer of conductive material present on the submount 2 on which the bottom surface 4a of the LED-Chip 4 is fixed.

The aforementioned matrix arrangement of the LED-chips 4 along the rows and columns, slightly offset in pairs, allows, on the one hand, for arrangement of the second bottom terminal 4d between the LED-chips 4 keeping it in view and, on the other hand, to control the area of occupation of the submount 2 by the LED-chips 4, thereby maintaining a high compactness of the light emitting surface (LES) of the multi-COB-LED lighting module 1.

Preferably, as shown in FIG. 1, the matrix of LED-chips 4 is structured so that each LED-chip 4 is bordered with, and surrounded by, a plurality of LED-chips 4, and has the first and/or or the second terminal, which is arranged adjacent to the second and/or to the first terminal of an adjacent LED-chip/s 4, respectively. The number of adjacent LED-chips 4 that adjoin/surround an LED-chip 4 can vary as a function of the position of the LED-chip 4 in the matrix. For example, in the accompanying Figures, the external LED-chips 4, i.e., arranged in the outer perimeter rows/columns of the matrix, can adjoin with an adjacent number of LED-chips 4 preferably ranging between three and six, and have a first terminal adjacent to the second terminal of an adjacent LED-chip 4. As regards, instead, the internal LED-chips 4, arranged on the internal rows/columns of the matrix, they can border with eight adjacent LED-chips 4. The internal LED-chips 4 can each have the bottom terminal and the top terminal which are adjacent to the top terminal and to the bottom terminal, respectively, of two different LED-chips 4, set next to the LED-chip 4.

According to an example shown in FIG. 1, the LED-chips 4 are arranged on the sub-mount 2 so that they all have the same side, for example, the first side facing a common side of the multi-COB-LED module 1, and that the respective first terminals have the same orientation. FIG. 1 shows an example in which the LED-chips 4 have the respective first sides and the top terminals 4c accordingly arranged one with the other (facing the top side of the sheet in FIG. 1).

Figure 5:
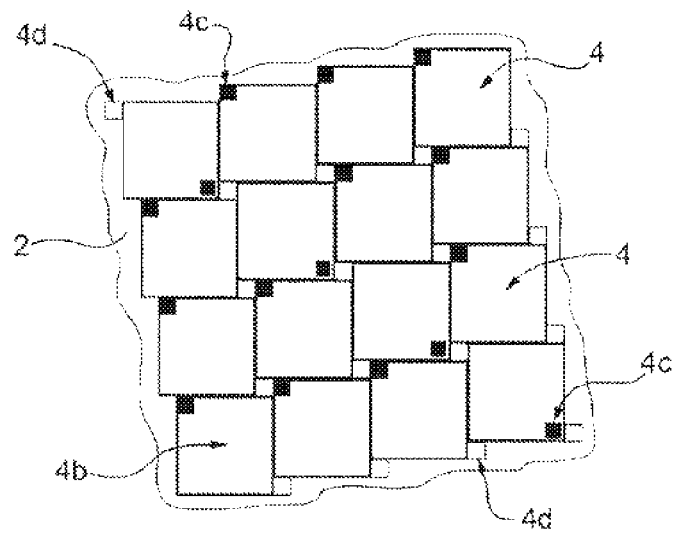
FIG. 5 is a simplified front view of a portion of a multi-COB-LED lighting module obtained according to an example.
Figure 6:
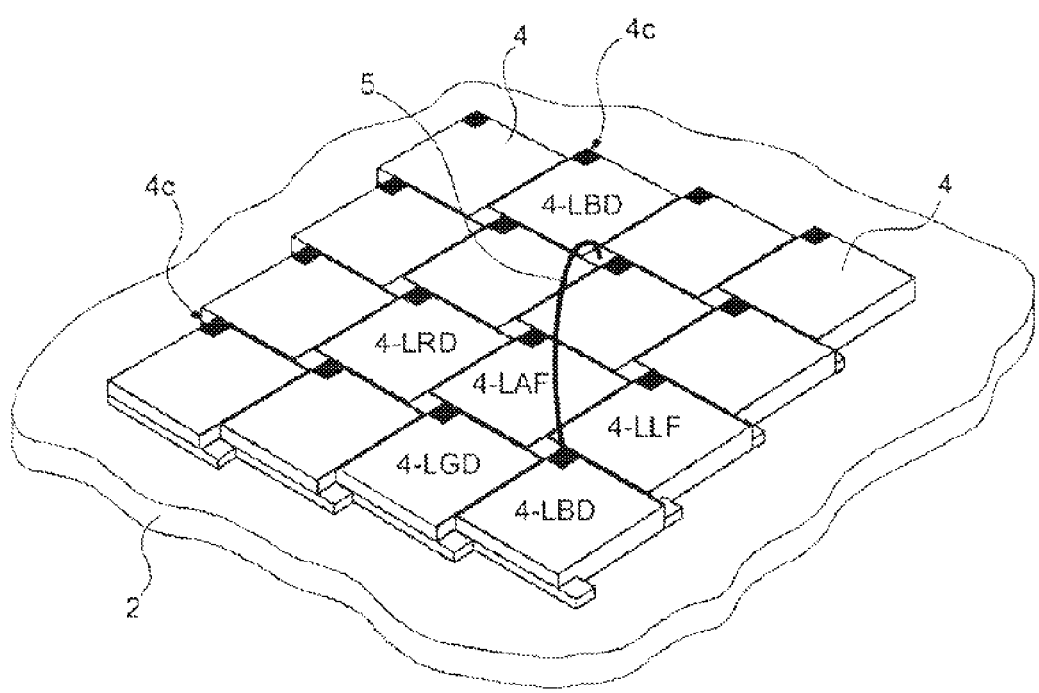
FIG. 6 is a schematic perspective view of a portion of the multi-COB-LED lighting module.

However, according to other examples, the LED-chips 4 can have a mutually different orientation. For example, FIG. 5 shows a central diagonal row of LED-chips 4, in which the latter have the first side facing one side of the multi-COB-LED module 1 opposite to the orientation of the other LED-chips 4 of the multi-COB-LED module 1.

With reference to some preferred examples shown in the accompanying Figures, the multi-COB-LED lighting module 1 can conveniently comprise six clusters of LED-chips 4 provided with LED-chips 4 arranged in a matrix in the manner described above, adapted to emit light radiation in six respective emission bands. Preferably, the six clusters of LED-chips can comprise, for example, by choice:

a) an LED-chip cluster comprising a plurality of direct emission blue LED-chips, b) an LED-chip cluster comprising a plurality of direct emission cyan LED-chips, c) an LED-chip cluster comprising a plurality of direct emission green LED-chips, d) an LED-chip cluster comprising a plurality of direct emission red LED-chips, e) an LED-chip cluster comprising a plurality of phosphor-converted amber LED-chips, f) an LED-chip cluster comprising a plurality of phosphor-converted lime (i.e., yellow-green) LED-chips.

As mentioned, the LED-chips 4 belonging to six clusters of LED-chips listed above emit in respective emission bands, which can be characterized in terms of dominant wavelength.

With reference to the preferred examples shown in the accompanying Figures, the direct emission blue LED-chips, hereinafter referred to as 4-LBD, have a dominant wavelength ranging between 443 nm and 457 nm, preferably 450 nm; the direct emission cyan LED-chips, hereinafter referred to as 4-LCD, have a dominant wavelength ranging between 478 nm and 493 nm, preferably 485 nm; the direct emission green LED-chips, hereinafter referred to as 4-LGD, have a dominant wavelength ranging between 518 nm and 532 nm, preferably 525 nm; the direct emission red LED-chips, hereinafter referred to as 4-LRD, have a dominant wavelength ranging between 621 nm and 635 nm, preferably 628 nm; the phosphor-converted amber LED-chips, hereinafter referred to as 4-LAF, have a dominant wavelength ranging between 583 nm and 597 nm, preferably 590 nm; the phosphor-converted lime LED-chips, hereinafter referred to as 4-LLF, have a dominant wavelength ranging between 563 nm and 577 nm, preferably 570 nm.

The LED-chips 4 of a same LED-chip cluster may be connected one to the other by wire bonds 5 (wire bonding) (only some of which have been shown for reasons of clarity) that extend over the top surfaces 4b of the LED-chips 4. Each wire bond 5 may connect the first terminal of an LED-chip 4 to the second terminal of another LED-chip 4.

According to a preferred example shown in the accompanying Figures, each wire bond 5 connects the bottom terminal 4d of an LED-chip 4 to the top terminal 4c of another LED-chip 4 belonging to the same LED-chip cluster. The LED-chips 4 belonging to the same LED-chip cluster can be electrically connected one to the other by the wire bonds 5 preferably, but not necessarily, according to a series circuit configuration. Preferably, the serial circuit configuration can provide a single branch, several branches or independent strings of LED-chips 4 in series, and one or more electrical control channels/circuits arranged in the submount 2 (not illustrated) to selectively control the branch/es/string/s.

Our lighting module should not be considered limited to the configuration in series described above but could envisage other alternative circuit configurations of connection between the LED-chips 4, i.e., in parallel or in parallel/series. In some examples, the LED-chips 4 can be connected in parallel with at least one electrical control channel/circuit. For example, 2 N (number) of LED-chips 4 of the same LED-chip cluster could be divided into two branches/strings each of which could comprise N (number) of LED-chips 4.

Conveniently, the LED-chip matrix 4 may be made to have at least one of the LED-chips 4 belonging to a first LED-chip cluster that adjoins with LED-chips 4 belonging to one or more of the other clusters of LED-chips, and connects to at least one second LED-chip 4 belonging to the same first LED-chip cluster by at least one wire bond 5. The wire bond 5 extends above the top surface/s 4b of one or more of the intermediate LED-chips 4, i.e., interposed between the first and the second connected LED-chips 4. Preferably, the wire bond 5 can extend astride, i.e., above, a number of intermediate adjacent LED-chips 4 ranging between two and three. For example, if the adjacent LED-chips 4 which diagonally separate the first and the second LED-chips 4 are two, the wire bond 5 can extend astride above three LED-chips 4.

The number of LED-chips 4 can vary depending on the sizes/shape of the multi-COB-LED lighting module 1. According to an example, the number of LED-chips 4 of the multi-COB-LED lighting module 1 can be eighty to ninety. In the example shown in FIG. 1, the multi-COB-LED lighting module 1 preferably comprises eighty-eight LED-chips. The LED-chips are arranged in a matrix and belong to the six clusters of LED-chips a)-f) listed above. Each of the LED-chips 4 belonging to the direct emission clusters of LED-chips (clusters a), b), c), d) is surrounded by, adjoins to, LED-chips 4 belonging to the other clusters of LED-chips 4. Preferably, the direct emission LED-chips 4 can be conveniently arranged on the submount, separated one from the other by the other LED-chips 4 (of different band), according to a discrete topological distribution, whose center is approximately coincident with the geometric center of the light emitting surface (LES).

For example, in the example shown in FIG. 1:

each of the direct emission 4-LGD green LED-chips can be surrounded by, borders with, a plurality of LED-chips 4 belonging to one or more of the remaining five clusters of LED-chips, and connects to another 4-LGD LED-chip by a wire bond 5 that extends above one or more LED-chips 4 interposed between the two 4-LGD connected LED-chips, each of the direct emission 4-LRD red LED-chips can be surrounded by, borders with, a plurality of LED-chips 4 belonging to one or more of the remaining five clusters of LED-chips and connects to another 4-LRD LED-chip by a wire bond 5 that extends above one or more LED-chips 4 interposed between the two 4-LRD connected LED-chips, each of the direct emission 4-LCD cyan LED-chips can be surrounded by, borders with, a plurality of LED-chips 4 belonging to one or more of the remaining five clusters of LED-chips and connects to another 4-LCD LED-chip by a wire bond 5 that extends above one or more LED-chips 4 interposed between the two 4-LCD connected LED-chips, each of the direct emission 4-LBD blue LED-chips can be surrounded by, borders with, a plurality of LED-chips 4 belonging to one or more of the remaining five clusters of LED-chips and preferably connects, in series, to another 4-LBD LED-chip, by a wire bond 5 that extends above one or more LED-chips 4 interposed between the two 4-LBD connected LED-chips.

As regard to the phosphor-converted 4-LLF lime LED-chips, they can be conveniently arranged in the matrix in positions close one to the other, along a substantially diagonal direction and each can have the bottom terminal 4d and the top terminal 4c that are adjacent to the top terminal 4c and the bottom terminal 4d, respectively, of two LED-chips 4 different from the 4-LLF lime LED-chips, preferably two 4-LAF amber LED-chips. As shown in the example of FIG. 1, the phosphor-converted 4-LLF lime LED-chips can, for example, form four clusters arranged/distributed in the matrix along four respective parallel diagonal directions and spaced apart one from the other.

As regard to the 4-LAF phosphor-converted amber LED-chips, they can be arranged in the matrix in positions close one to the other along a substantially diagonal direction and each have the bottom 4d and top 4c terminal that are adjacent to a top 4c and bottom 4d terminal, respectively, of two LED-chips 4 different from the 4-LAF amber LED-chips, preferably two 4-LLF lime LED-chips. As shown in the example of FIG. 1, the 4-LAF amber LED-chips can, for example, form four clusters arranged/distributed in the matrix along four respective parallel diagonal directions and spaced apart one from the other.

Preferably, the four clusters of 4-LAF amber LED-chips can be arranged on the submount to form four respective separate diagonal rows, whose geometric center is approximately coincident with the geometric center of the light emitting surface (LES). Similarly, the four clusters of 4-LLF lime LED-chips can be arranged on the submount 2 to form four separate diagonal rows, whose geometric center is approximately coincident with the geometric center of the light emitting surface (LES).

Conveniently, in the LED-chip matrix 4 shown in the example of FIG. 1, the area occupation ratios of the submount 2 by the LED-chips 4 belonging to the clusters of LED-chips a), b), c), d), e) and f) can be respectively:
I) 1:1:1:2:2:1 to create the respective luminous flux ratios:
II) 50%; 125%; 250%; 800%: 450%: 100% (+ or −25%).

In other words, the number of 4-LAF phosphor-converted amber LED-chips and the number of 4-LLF phosphor-converted lime LED-chips in the multi-COB-LED module 1, can conveniently be double the number of LED-chips 4 belonging to each of the remaining four clusters of LED-chips a), b), c), d) listed above.

We found that the multi-COB-LED lighting module 1 made according to the geometric configuration shown in FIG. 1 is conveniently characterized by: an electrical power of about 350 W; a light emitting surface (LES) having a diameter of about 16 mm; and a luminous flux of about 16 klm (kilo-lumen) at 25° C. (about 45 lm/W).

Our lighting modules are not limited to the use of eighty-eight LED-chips as shown in FIG. 1 but may provide other configurations. In fact, according to a different convenient example the number of LED-chips 4 of the multi-COB-LED lighting module 1 can be forty to fifty. For example, FIG. 4 shows another possible example of the multi-COB-LED lighting module 1 that differs from the multi-COB-LED lighting module 1 shown in FIG. 1 since it comprises forty-four LED-chips 4.

Figure 4:
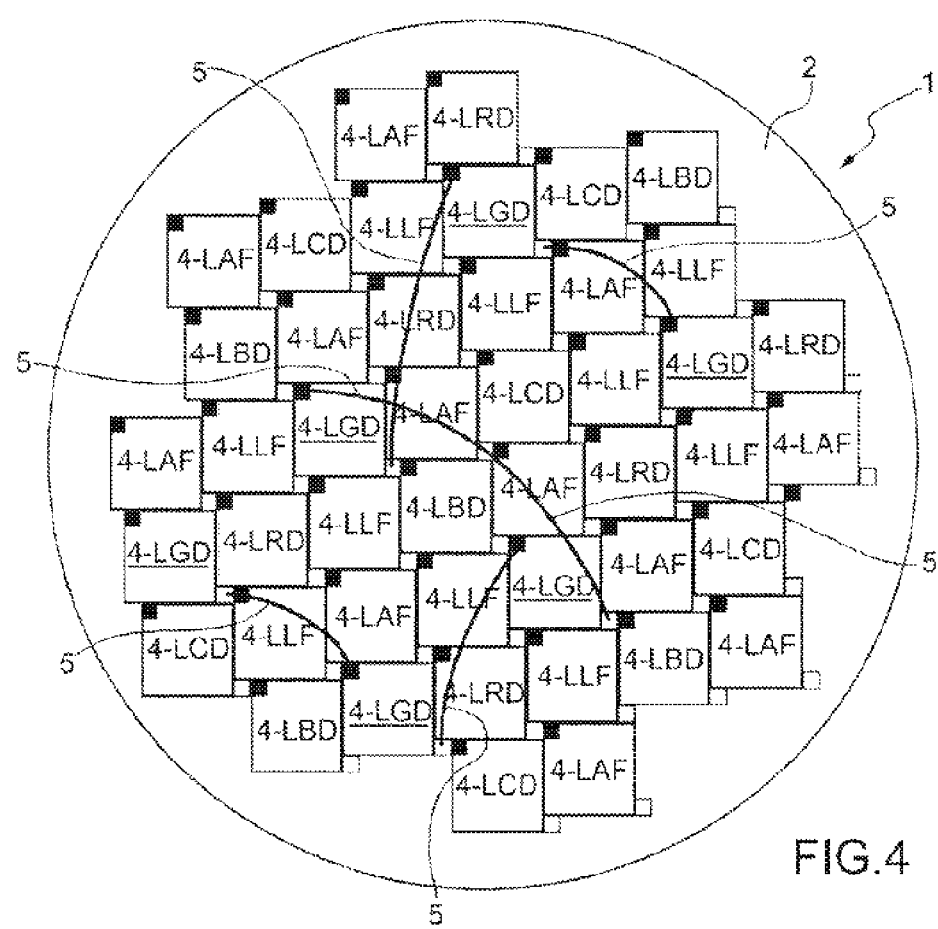
FIG. 4 is a simplified front view of a multi-COB-LED lighting module obtained according to an example.

As shown in the example of FIG. 4, the 4-LLF phosphor-converted lime LED-chips can be arranged in the matrix in positions close to each other but to have the bottom 4d and top 4c terminals arranged approximately aligned one with the other along the diagonal direction. As shown in the example of FIG. 4, the bottom 4d and top 4c terminals of each 4-LLF lime LED-chip can, moreover, be adjacent to the top 4c and bottom 4d terminals, respectively, of two adjacent 4-LLF lime LED-chips. Similarly, as shown in the example of FIG. 4, also the 4-LAF phosphor-converted amber LED-chips can be arranged in the matrix in positions close one to the other to have the bottom 4d and top 4c terminals arranged approximately aligned along the diagonal direction adjacent to one another. Furthermore, the bottom 4d and top 4c terminals of each 4-LAF amber LED-chip are adjacent to the top 4c and bottom 4d terminals, respectively, of two adjacent 4-LAF amber LED-chips.

Moreover, similarly to the example shown in FIG. 1, in the example shown in FIG. 4, each of the direct emission LED-chips 4, for example, the 4-LRD red, 4-LVD green, 4-LBD blue and 4-LCD cyan LED-chips is surrounded by, borders with, a plurality of LED-chips 4 belonging to one or more of the other clusters of LED-chips and connects in series to another LED-chip 4 belonging to the same LED-chip cluster by a wire bond 5 that extends above one or more LED-chips 4 interposed between the two connected LED-chips 4. For clarity only, FIG. 4 shows the connections in series of the 4-LGD green LED-chips by wires 5.

We found that the multi-LED lighting module 1 made according to the geometric configuration shown in FIG. 4 is conveniently characterized by: an electrical power of about 175 W; a light emitting surface (LES) having a diameter of about 11 mm, and a luminous flux of about 8 klm (kilo-lumens) at about 25° C. (about 45 lm/W).

Our lighting modules are not limited to the use of six clusters of LED-chips as shown in the examples of FIGS. 1 and 4. In fact, we found that a number of clusters of LED-chips could conveniently be between five and eight.

Our lighting modules are not limited to clusters of LED-chips having the LED-chips operating in the emission bands described above. In this regard, we found that it is possible to use, optionally as an alternative and/or in addition to the clusters of LED-chips from a) to f) described above, one or more of the following clusters:

g) an LED-chip cluster comprising a plurality of direct emission aquamarine LED-chips (direct aquamarines) in which the dominant wavelength can range between 495 nm and 505 nm, preferably approximately 500 nm;

h) an LED-chip cluster comprising a plurality of direct emission or phosphor-converted deep red LED-chips in which the dominant wavelength can range between 633 nm and 643 nm, preferably approximately 638 nm; and/or i) an LED-chip cluster comprising a plurality of direct emission or phosphorus conversion deep blue LED-chips in which the dominant wavelength can range between 425 nm and 435 nm, preferably approximately 430 nm; and/or l) an LED-chip cluster comprising a plurality of warm white LED-chips, m) an LED-chip cluster comprising a plurality of cool white LED-chips.

Our lighting modules are not limited to clusters of LED-chips operating in the visible light spectrum. For example, we found that one or more of the following clusters can be used, optionally as an alternative and/or in addition to the clusters of LED-chips from a) to m) described above:

n) an LED-chip cluster comprising a plurality of UV-A (Ultraviolet A) LED-chips; or o) an LED-chip cluster comprising a plurality of UV-B (Ultraviolet B) LED-chips; or p) an LED-chip cluster comprising a plurality of UV-C (Ultraviolet C) LED-chips; or q) an LED-chip cluster comprising a plurality of IR (Infrared Radiation) LED-chips.

Our lighting modules are not limited to the numerical ratio of area occupancy described in point I) and/or to the luminous flux ratio of point II) but can provide different area and flow ratios of LED-chips 4.

In the event that there is a need to obtain a dominant warm white light effect, it may be convenient to increase the number of 4-LAF amber LED-chips and the number of 4-LRD red LED-chips, and to reduce at least the number of 4-LBD blue LED-chips, of 4-LLF lime LED-chips, 4-LGD green LED-chips, and 4-LCD cyan LED-chips.

Conversely, if there is a need to obtain a dominant effect of cold white light, it may be convenient to increase the number of at least 4-LBD blue LED-chips, the 4-LLF lime LED-chips, the 4-LGD green LED-chips, and the 4-LCD cyan LED-chips and to decrease the number of 4-LAF amber LED-chips and the 4-LRD red LED-chips.

Our lighting modules are not limited to the use of LED-chips provided with a single top connection terminal 4c but can provide for the use of COB LED-chips provided with two or more top connection terminals 4c.

Figure 7:
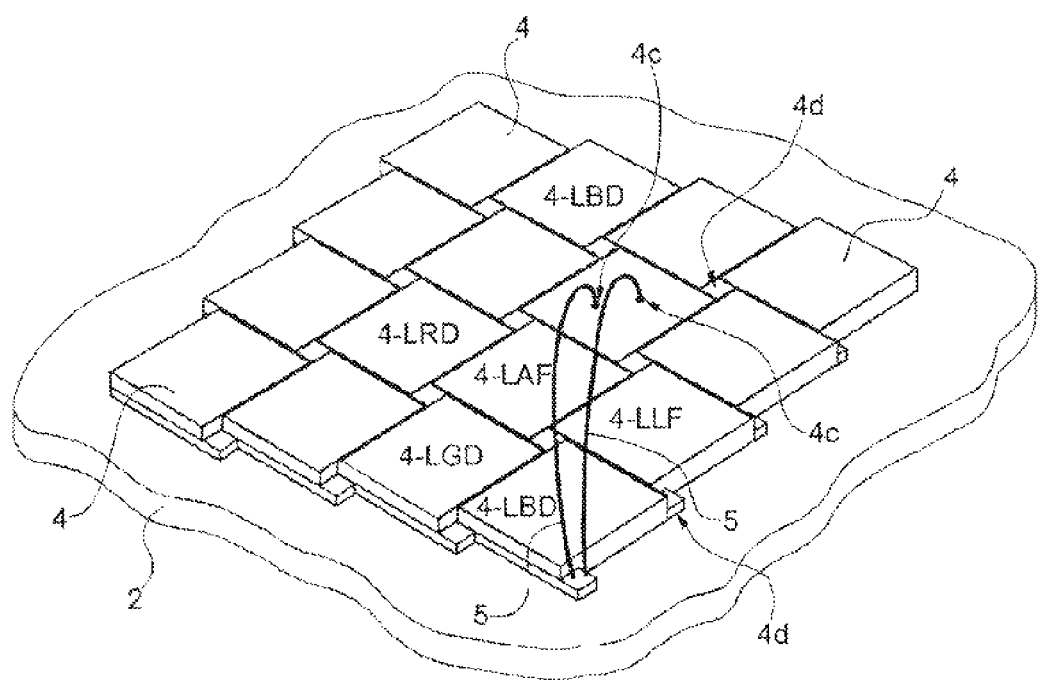
FIG. 7 is a simplified front view of a portion of a multi-COB-LED lighting module obtained according to another example.

FIG. 7 shows by way of non-limiting example a portion of a multi-COB-LED lighting module 1 in which the LED-chips 4 are provided with two top connection terminals 4c, preferably central. The two top connection terminals 4c can be preferably associated with two cathodes or with two anodes.

In the example shown in FIG. 7, one of the two LED-chips 4 belonging the same LED-chip cluster borders with LED-chips 4 of different clusters of LED-chips and has the two top connection terminals 4c connected to the bottom terminal of the other LED-chip 4 belonging to the same LED-chip cluster by two respective wire bonds 5. The two wire bonds 5 extend above the bordering LED-chips 4, interposed between the two connected LED-chips.

The multi-COB-LED lighting module allows for an increase in the pre-mixing of the light already at the time of emission by the LED-chips without compromising the compactness of the light emitting surface.

Finally, it is clear that modifications and variations may be made to the multi-COB-LED lighting module described above without thereby departing from the scope of this disclosure defined by the appended claims.

This application claims priority from Italian Patent Appln. No. 102018000004928, filed on Apr. 27, 2018, the entire disclosure of which is incorporated by reference.

The invention claimed is:

1. A multi-COB-LED lighting module comprising:
a submount; and
a plurality of clusters of LED-chips that emit light radiation in respective emission bands, wherein
each LED-chip cluster comprises a plurality of LED-chips arranged on said submount by chip on board technology and emit light radiation in a respective emission band, and
at least two LED-chips of at least a first LED-chip cluster each borders with a plurality of LED-chips belonging to one or more clusters of LED-chips different from said first LED-chip cluster and connect one to the other by at least a wire bond that extends above one or more of said adjoining LED-chips.

2. The lighting module according to claim 1, wherein said LED-chips are arranged on said submount in positions adjacent one to the other to approximately form an LED-chip matrix and each comprises one or more top connection terminals and at least one bottom connection terminal, and
at least one top terminal of a first of said two LED-chips of said first LED-chip cluster connects to a bottom terminal of a second LED-chip of said first LED-chip cluster by a wire bond that extends above one or more of said adjoining LED-chips.

3. The lighting module according to claim 2, wherein said top terminal is arranged on the top surface of the LED-chip and said bottom terminal protrudes from a side of the LED-chip.

4. The lighting module according to claim 2, wherein at least a terminal of said top/bottom terminal of an LED-chip is adjacent to a bottom/top terminal of another LED-chip.

5. The lighting module according to claim 1, wherein said clusters of LED-chips comprise five or more of:
a) an LED-chip cluster comprising a plurality of direct emission blue LED-chips, or b) an LED-chip cluster comprising a plurality of direct emission cyan LED-chips, or
c) an LED-chip cluster comprising a plurality of direct emission green LED-chips, or
d) an LED-chip cluster comprising a plurality of direct emission red LED-chips, or
e) an LED-chip cluster comprising a plurality of phosphor-converted amber LED-chips, or
f) an LED-chip cluster comprising a plurality of phosphor-converted lime LED-chips, or
g) an LED-chip cluster comprising a plurality of direct emission aquamarine LED-chips, or
h) an LED-chip cluster comprising a plurality of direct emission or phosphor-converted deep red LED-chips, or
i) an LED-chip cluster comprising a plurality of direct emission or phosphor-converted deep blue LED-chips, or
l) an LED-chip cluster comprising a plurality of warm white LED-chips, or
m) an LED-chip cluster comprising a plurality of cold white LED-chips, or
n) an LED-chip cluster comprising a plurality of UV-A LED-chips, or
o) an LED-chip cluster comprising a plurality of UV-B LED-chips, or
p) an LED-chip cluster comprising a plurality of UV-C LED-chips, or
q) an LED-chip cluster comprising a plurality of IR LED-chips.

6. The lighting module according to claim 1, wherein said at least first LED-chip cluster comprises one of:
a) an LED-chip cluster comprising a plurality of direct emission blue LED-chips, or
b) an LED-chip cluster comprising a plurality of direct emission cyan LED-chips, or
c) an LED-chip cluster comprising a plurality of direct emission green LED-chips, or
d) an LED-chip cluster comprising a plurality of direct emission red LED-chips, or
h) an LED-chip cluster comprising a plurality of direct emission or phosphor-converted deep red LED-chips, or
i) an LED-chip cluster comprising a plurality of direct emission or phosphor-converted deep blue LED-chips, or
l) an LED-chip cluster comprising a plurality of warm white LED-chips, or
m) an LED-chip cluster comprising a plurality of cold white LED-chips, or
n) an LED-chip cluster comprising a plurality of UV-A LED-chips, or
o) an LED-chip cluster comprising a plurality of UV-B LED-chips, or
p) an LED-chip cluster comprising a plurality of UV-C LED-chips, or
q) an LED-chip cluster comprising a plurality of IR LED-chips.

7. The lighting module according claim 1, wherein the LED-chips belonging to a same LED-chip cluster electrically connect one to the other by said wire bonds according to a series/parallel configuration.

8. The lighting module according to claim 1, comprising about eighty to about ninety of said LED-chips.

9. The lighting module according to claim 1, wherein said LED-chips are quadrangular, square, hexagonal or rhomboidal shaped.

10. The lighting module according to claim 1, wherein said LED-chips have dimensions of about 1.43 mm×1.43 mm (45×45 mils).

* * * * *